United States Patent
Tseng et al.

(10) Patent No.: US 12,002,647 B2
(45) Date of Patent: Jun. 4, 2024

(54) ADJUSTABLE SUPPORT FOR ARC CHAMBER OF ION SOURCE

(71) Applicant: Taiwan Semiconductor Manufacturing Company, Ltd., Hsinchu (TW)

(72) Inventors: Po-Tang Tseng, Hsinchu (TW); Ching-Heng Yen, Hsinchu (TW); Tai-Kun Kao, Hsinchu (TW); Sheng-Tai Peng, Miaoli County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 248 days.

(21) Appl. No.: 17/376,208

(22) Filed: Jul. 15, 2021

(65) Prior Publication Data

US 2022/0336181 A1 Oct. 20, 2022

Related U.S. Application Data

(60) Provisional application No. 63/175,301, filed on Apr. 15, 2021.

(51) Int. Cl.
| | |
|---|---|
| *H01J 27/08* | (2006.01) |
| *H01J 27/02* | (2006.01) |
| *H01J 37/317* | (2006.01) |
| *H01L 21/26* | (2006.01) |

(52) U.S. Cl.
CPC ............ *H01J 27/08* (2013.01); *H01J 27/022* (2013.01); *H01J 37/3171* (2013.01); *H01L 21/26* (2013.01); *H01J 2237/31701* (2013.01)

(58) Field of Classification Search
CPC ...... H01J 27/08; H01J 27/022; H01J 37/3171; H01J 2237/31701; H01J 37/15; H01J 2237/061; H01J 37/08; H01J 2237/082; H01J 37/317; H01L 21/26
USPC ............... 250/492.1–492.3, 423 R, 426, 427
See application file for complete search history.

(56) References Cited

U.S. PATENT DOCUMENTS

| | | | | |
|---|---|---|---|---|
| 5,604,350 | A * | 2/1997 | Chu | H01J 27/022 250/426 |
| 6,300,636 | B1 * | 10/2001 | Shih | H01J 27/08 250/311 |
| 7,365,346 | B2 * | 4/2008 | Sasaki | H01J 37/08 250/398 |
| 8,658,986 | B1 * | 2/2014 | Jerez | H01J 27/00 250/426 |
| 2009/0101834 | A1 * | 4/2009 | Spraggon | H01J 37/08 250/492.21 |
| 2012/0013249 | A1 * | 1/2012 | Jerez | H01J 37/08 313/613 |

* cited by examiner

*Primary Examiner* — Michael Maskell
(74) *Attorney, Agent, or Firm* — Lippes Mathias LLP

(57) ABSTRACT

An assembly present in an ion source for supporting an arc chamber upon a base plate includes a first arc support plate, a first screw, and a second screw. The first screw passes through a smooth through-hole in an arm of the first arc support plate and extends into a bore in the base plate. The second (or adjustable) screw passes through a threaded through-hole in an arm of the first arc support plate and engages an upper surface of the base plate itself, and can be used to change the altitude and angle of the first arc support plate relative to the base plate. This adjustment ability improves the beam quality of the ion source.

20 Claims, 14 Drawing Sheets

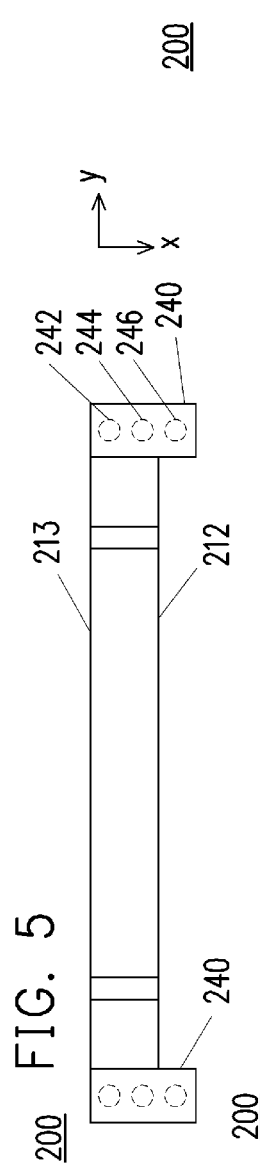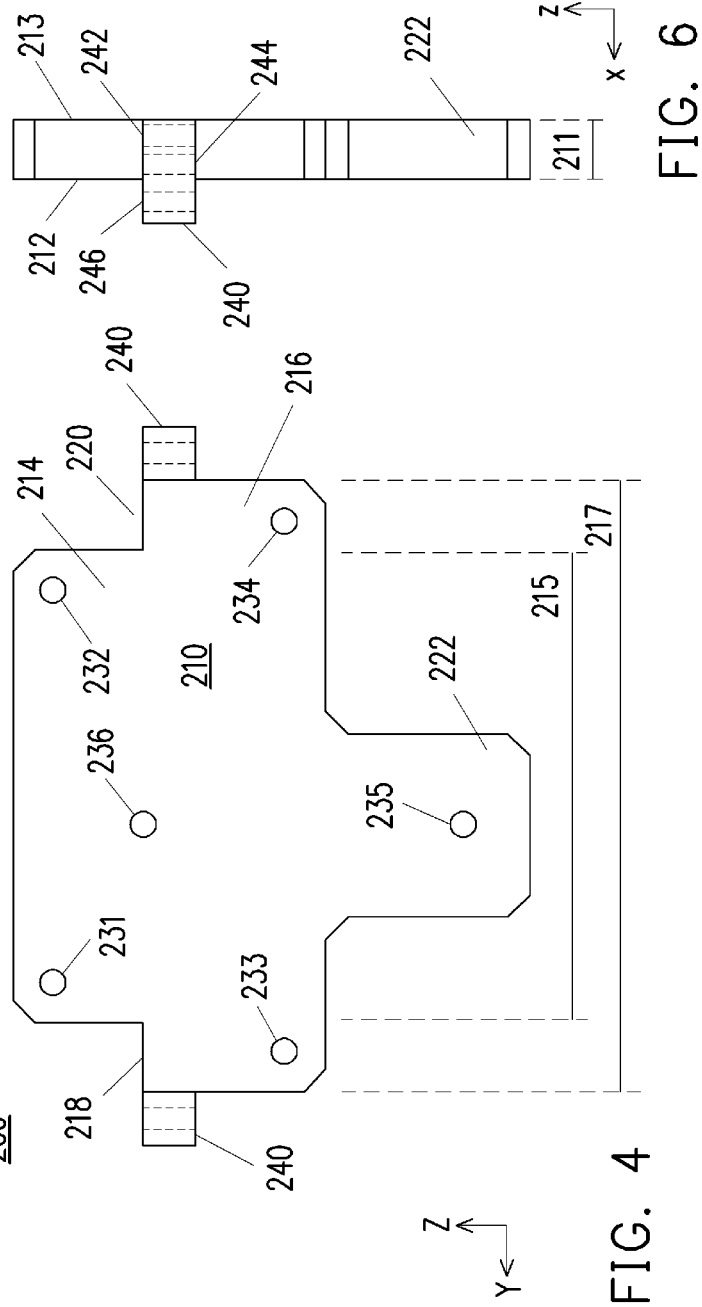

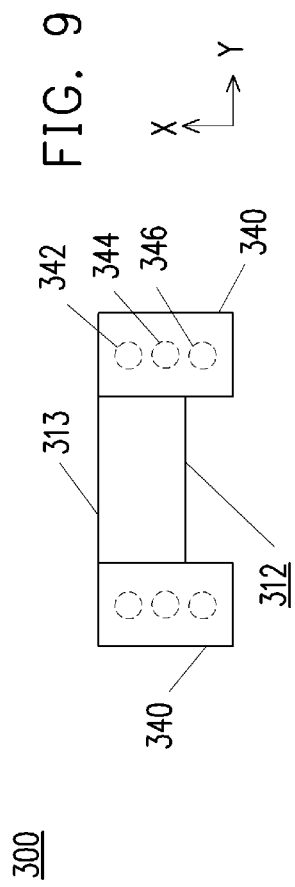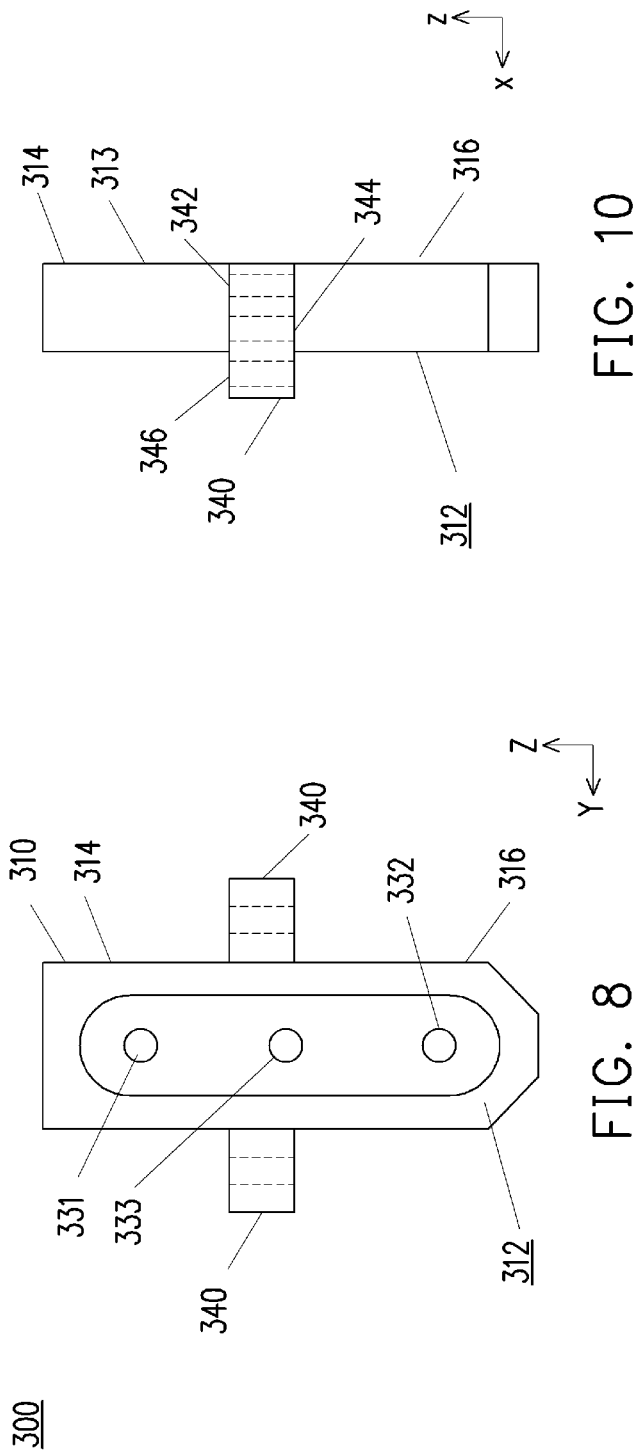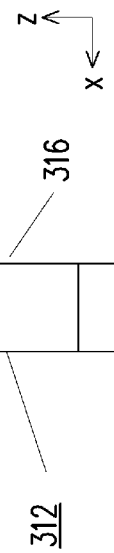

ADJUSTABLE SUPPORT FOR ARC CHAMBER OF ION SOURCE

PRIORITY CLAIM AND CROSS-REFERENCE

This application claims priority to U.S. Provisional Patent Application Ser. No. 63/175,301, filed on Apr. 15, 2021, which is incorporated by reference in its entirety.

BACKGROUND

Ion implantation is a process used in the manufacturing of semiconductor devices. Implantation of various atoms into a silicon crystal lattice modifies the conductivity of the lattice in the implanted location, permitting the manufacture of the various parts of a transistor. An ion implanter generally includes an ion source, a beam line, and a process chamber. The ion source produces ions. The beam line organizes the ions into a beam having high purity in terms of ion mass, energy, and species. The ion beam is then used to irradiate a substrate in the process chamber.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 is a front view of a first embodiment of a first arc support plate, in accordance with some embodiments.

FIG. 5 is a top view of the first arc support plate of FIG. 4.

FIG. 6 is a side view of the first arc support plate of FIG. 4.

FIG. 8 is a front view of a first embodiment of a second arc support plate, in accordance with some embodiments.

FIG. 9 is a top view of the second arc support plate of FIG. 8.

FIG. 10 is a side view of the second arc support plate of FIG. 8.

DETAILED DESCRIPTION

Figure 1:
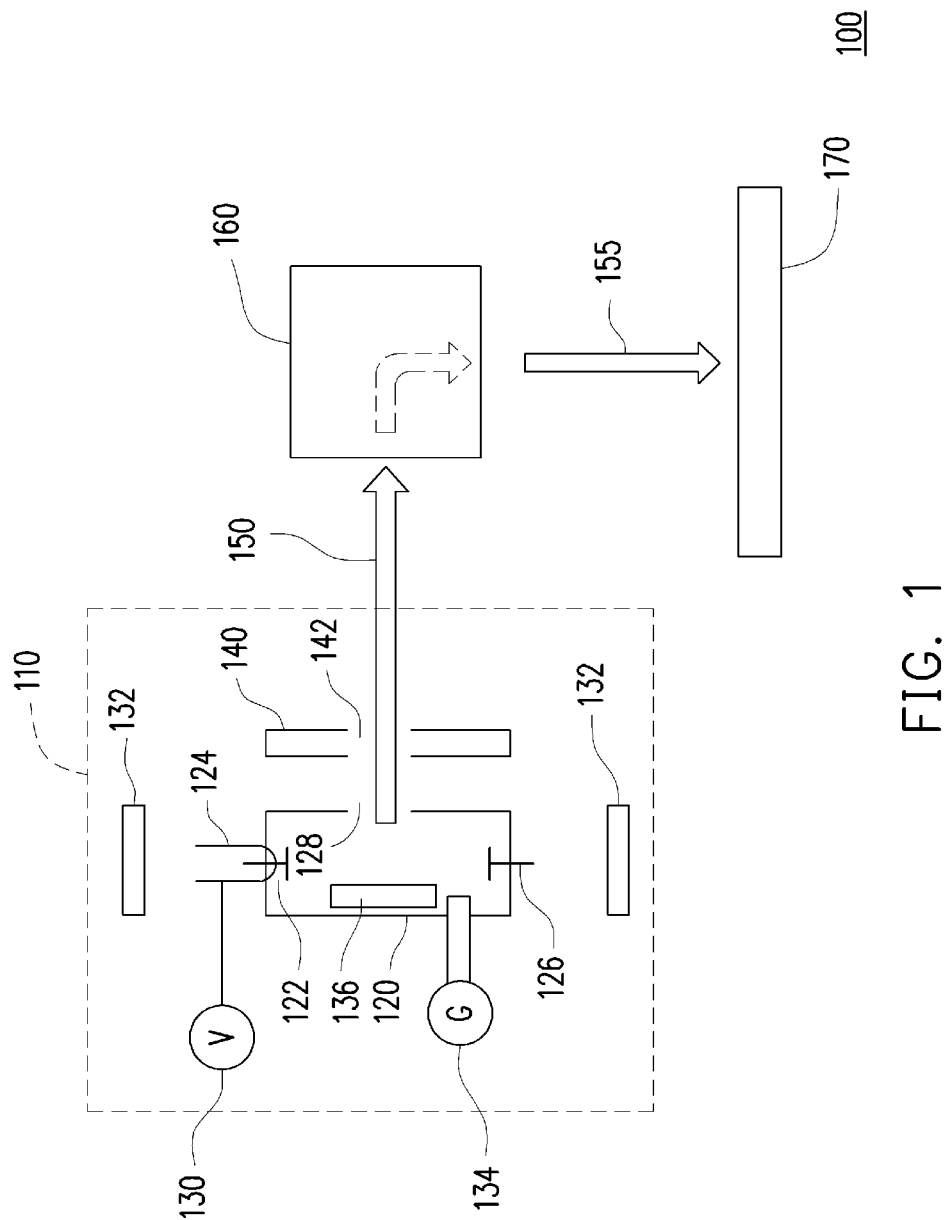
FIG. 1 is a schematic diagram of an ion implanter, with which the ion sources of the present disclosure can be used in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Numerical values in the specification and claims of this application should be understood to include numerical values which are the same when reduced to the same number of significant figures and numerical values which differ from the stated value by less than the experimental error of conventional measurement technique of the type described in the present application to determine the value. All ranges disclosed herein are inclusive of the recited endpoint.

FIG. 1 is a schematic diagram of an ion implanter (not drawn to scale) 100, which is generally performed in a vacuum environment. The ion implanter system includes a new ion source 110 according to various embodiments of the present disclosure. The ion source includes an arc chamber 120. One end of the arc chamber includes a cathode 122 with a metal filament 124 located therein, and an anode 126 is present at the opposite end of the arc chamber. The cathode and the filament may be made of any suitable materials, for example a refractory metal or alloy. In particular embodiments, such materials can include niobium, molybdenum, tantalum, tungsten, rhenium, and alloys and combinations thereof. In particular embodiments, the cathode and the filament comprise tungsten.

The metal filament is coupled to a first power supply 130 capable of supplying a high current. When heated by the current, the metal filament releases electrons. The cathode emits secondary electrons when the electrons from the filament hit the cathode. A source magnet 132 creates a magnetic field inside the arc chamber to confine the electrons. A gas source 134 supplies a dopant gas (e.g., $BF_3$ or $AsH_3$ or $GeF_4$ or $PH_3$) to the arc chamber. A high voltage is then applied across the cathode and the anode to produce a plasma. A biased extraction electrode 140 can then extract ions from the plasma through an exit aperture/slit 128 of the arc chamber. A repeller 136 at the other end of the arc chamber opposite the extraction electrode may be biased to repel the ions and send them through the exit slit. The extraction electrode itself includes a slit 142 through which the ion beam 150 passes.

The resulting ion beam 150 enters the beamline 160. The ion beam first passes through a mass analyzer where the beam is focused and bent through an angle, which can range for example from 70° to 90°. Electromagnetic fields can be used to change the radius of the bend and thus select the ion species that will exit the mass analyzer based on their mass to charge (m/e) ratio. Only the desired ions having the selected m/e ratio will exit the mass analyzer. Lighter ions will hit the inner wall of the bend, while heavier ions will hit the outer wall of the bend. A movable aperture or electromagnetic lens can be used to locate the exit in the appropriate location for the desired ions. In this way, only the desired ions are selected from the different ions that may originate from the ion source. The beam of selected ions is then accelerated to the desired energy. Other elements, such as lenses, electrodes, and filters may also be present in the beam line to produce the final desired ion beam 155. The ion beam 155 is then steered using electromagnetic fields to strike a region of a substrate 170, so these ions can be implanted into the substrate as dopants at desired locations/depths. The substrate can be, for example, a wafer made of silicon, germanium arsenide (GaAs), or gallium nitride (GaN). In particular embodiments, ion implantation methods described in the present disclosure use silicon wafers as the substrate.

These dopants can enable the device or structure to have desired properties, which are essential for various applications. For example, source and drain regions of a semiconductor device are formed using dopants that have a different polarity from the substrate, and allow the semiconductor device to be turned on and off with a gate voltage. The source and drain regions can be formed by implanting ions in desired locations on the substrate.

Figure 2:
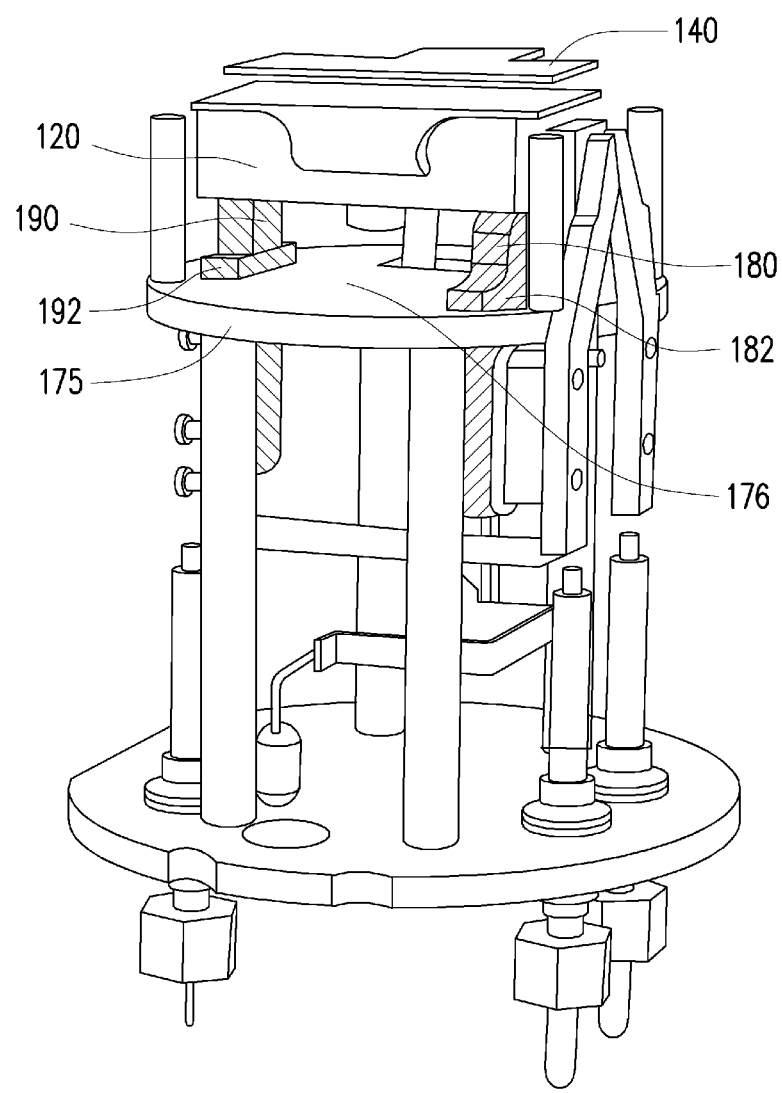
FIG. 2 is a schematic diagram of an ion source in accordance with some embodiments.

Continuing, FIG. 2 is a schematic diagram showing the ion source 110 of the present disclosure, in accordance with some embodiments. As seen here, the arc chamber 120 and the extraction electrode 140 are separately attached to a base plate 175. The extraction electrode 140 is mounted upon an adjustable support arm (not visible) which is affixed to the base plate 175. The arc chamber 120 is mounted to a first arc support plate 180 and a second arc support plate 190. The base plate 175 contains two recesses, one on each side, which is engaged by an arc support plate. Arms 182, 192 on each arc support plate rest upon the upper surface 176 of the base plate. Other portions of the ion source are located below the base plate, such as those components that provide the dopant gas. It should again be noted that the ion source can be oriented in any direction, such as vertical or horizontal.

Figure 3A:
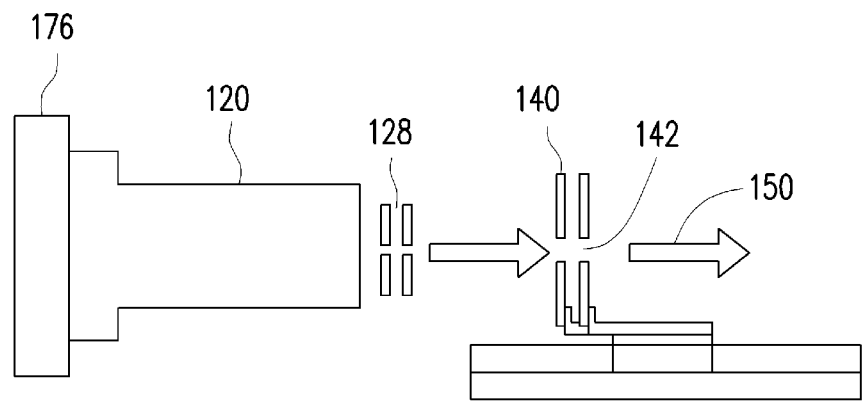
FIG. 3A is a schematic diagram illustrating an arc chamber which has an exit slit that is aligned with the slit of the extraction electrode, in accordance with some embodiments.

Systems incorporating the ion sources of the present disclosure operate advantageously as illustrated in FIG. 3A. As described further herein, the exit slit 128 of the arc chamber 120 is more easily aligned with the slit 142 of the extraction electrode, so that the ions of the ion beam enter the beamline instead of being deflected (by the extraction electrode or other components).

Figure 3B:
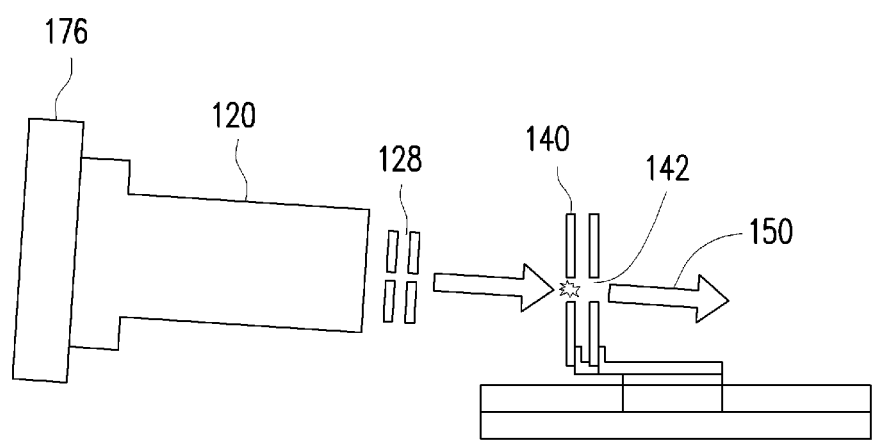
FIG. 3B is a schematic diagram illustrating an arc chamber which has an exit slit that is not aligned with the slit of the extraction electrode.

The ion sources and components of the present disclosure can avoid problems that occur when, over time, due to high temperature exposure, the upper surface can warp. This can occur, for example, due to deficiencies in the design of the cooling system, which typically do not focus on the base plate itself. As seen in FIG. 3B, this warpage of the base plate can cause the arc chamber 120 (and more specifically, the exit slit 128) to lose alignment with the slit 142 of the extraction electrode 140. As a result, the ion beam 150 does not travel straight in the desired direction, resulting in lower beam quality due to lower amounts of the desired ions being provided by the ion source. This affects further downstream activities. For example, referring back to FIG. 1, the ion beam must be aimed at the desired location of a substrate for a longer time period to obtain the desired dose of dopant. This additional time decreases the overall throughput of the ion implanter.

The ion sources and systems of the present disclosure include, in various embodiments, arc support plates for supporting the arc chamber which permit adjustment of both the altitude and the angle of the arc chamber (rather than fixing the arc chamber in a given position). In some embodiments, the arc support plate includes at least one arm (and in further embodiments, two arms on opposite sides) that extend forward past a front face of the arc support plate. Each arm contains a plurality of through-holes, with at least one of the through-holes being located beyond the front face of the arc support plate. In particular embodiments, one through-hole is smooth (i.e. does not contain a thread), and is aligned with a threaded bore in the base plate. A threaded screw passing through this smooth through-hole is used to fix the arc support plate to the base plate. Another through-hole is aligned with the upper surface of the base plate, and is threaded internally. A threaded screw passing through this threaded through-hole engages the surface, and can change the altitude and the angle of the arc support plate (and the attached arc chamber) relative to the base plate.

Figure 7:
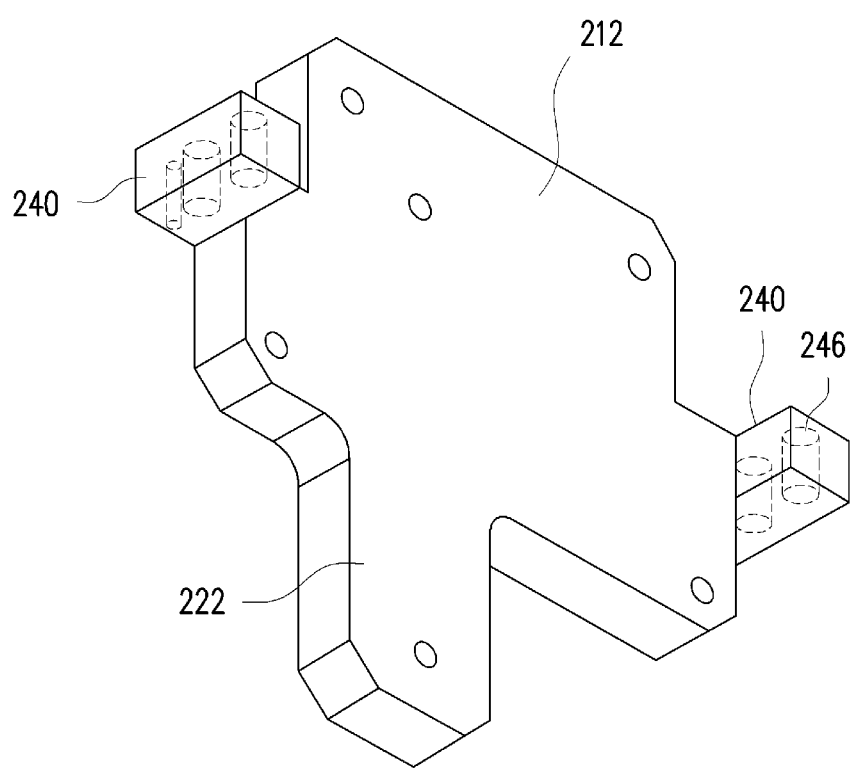
FIG. 7 is a perspective view of the first arc support plate of FIG. 4.

FIGS. 4-7 are different views of a first embodiment of a first arc support plate 200, in accordance with some embodiments. FIG. 4 is a front view. FIG. 5 is a top view. FIG. 6 is a side view. FIG. 7 is a perspective view.

The first arc support plate 200 includes a main portion 210 having a front face 212 and a rear face 213. The main portion includes an upper end 214 and a lower end 216. Two arms 240 are present on opposite sides of the main portion, with the front face being located between the two arms. The arms can be considered as defining the upper end and the lower end. Two shoulders 218, 220 are present near the arms, such that the length 215 of the upper end is shorter than the length 217 of the lower end. A leg 222 extends downwards from the lower end of the main portion, and is offset to one side. The main portion and the leg generally have a uniform thickness 211 (in the direction of the x-axis). Six holes extend through the thickness of the main portion and through front face. These holes are used for engaging fasteners that attach various components (including the arc chamber) to the arc support plate. Two holes 231, 232 are located at the upper end, two holes 233, 234 are located at the lower end, one hole 235 is located in the leg, and one hole 236 is located in a central area of the main portion and vertically aligned with the hole located in the leg.

Each arm 240 extends beyond the front face 212 in the direction of the x-axis, as best seen in FIG. 5 and FIG. 6. A plurality of through-holes is present in each arm 240. As illustrated here, three through-holes 242, 244, 246 are shown in dashed lines. Through-hole 246 is threaded, while through-holes 242, 244 are smooth. In this embodiment, the threaded through-hole 246 is also located in the portion of the arm located beyond the front face. In particular embodiments, the through-holes have a diameter of 5 mm+/−1 mm.

As a result, two additional alignment holes (i.e. threaded through-holes 246) and two additional adjustable (or alignment) screws (not shown here) are added to the modified first arc support plate.

Figure 11:
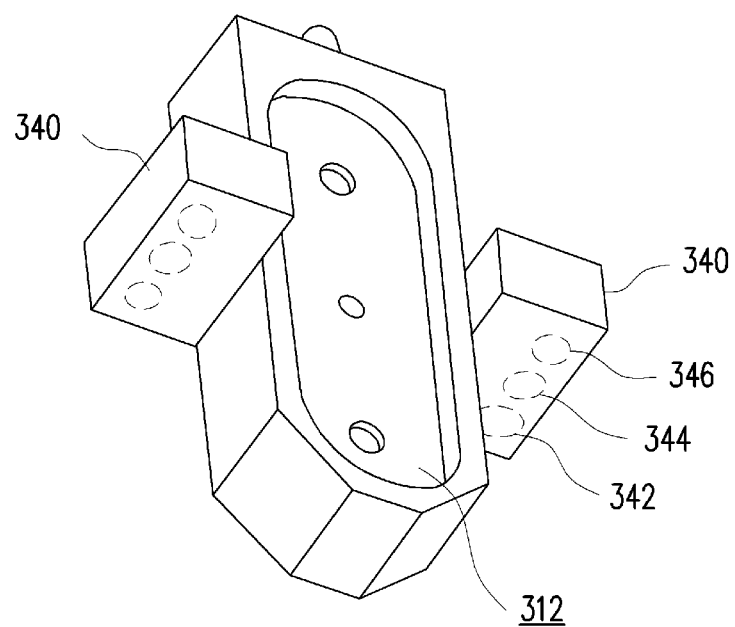
FIG. 11 is a perspective view of the second arc support plate of FIG. 8.

FIGS. 8-11 are different views of a first embodiment of a second arc support plate 300, in accordance with some embodiments. FIG. 8 is a front view. FIG. 9 is a top view. FIG. 10 is a side view. FIG. 11 is a perspective view.

Similarly, the second arc support plate 300 also includes a main portion 310 having a front face 312 and a rear face 313. The main portion 310 includes an upper end 314 and a lower end 316. Two arms 340 are present on opposite sides of the central area of the main portion, with the front face 312 being located between the two arms. The arms can be considered as defining the upper end and the lower end. Three holes 331, 332, 333 extend through the front face along a longitudinal axis thereof, which are used for engaging fasteners that attach various components (including the arc chamber) to the arc support plate. One hole 331 is located at the upper end, one hole is located at the lower end 332, and one hole 333 is located in a central area of the main portion. Unlike the modified first arc support plate illustrated in FIGS. 4-7, the modified second arc support plate does not include shoulders or a leg.

Each arm extends beyond the front face in the direction of the x-axis, as best seen in FIG. 9 and FIG. 10. A plurality of through-holes is present in each arm. As illustrated here, three through-holes 342, 344, 346 are shown in dashed lines. Through-hole 346 is threaded, while through-holes 342, 344 are smooth. In this embodiment, the threaded through-hole 346 is also located in the portion of the arm located beyond the front face. In particular embodiments, the through-holes have a diameter of 5 mm+/−1 mm.

As a result, two additional alignment holes (i.e. threaded through-holes 346) and two additional adjustable (or alignment) screws (not shown) are added to the modified second arc support plate.

It is noted that the first arc support plate 200 and the second arc support plate 300 have different shapes. This is because the first arc support plate also supports additional components for using the metal filament as described in FIG. 1. Because the second arc support plate does not need to support such components, it can be of relatively smaller size. This will be seen further in FIG. 14, below.

Figure 12:
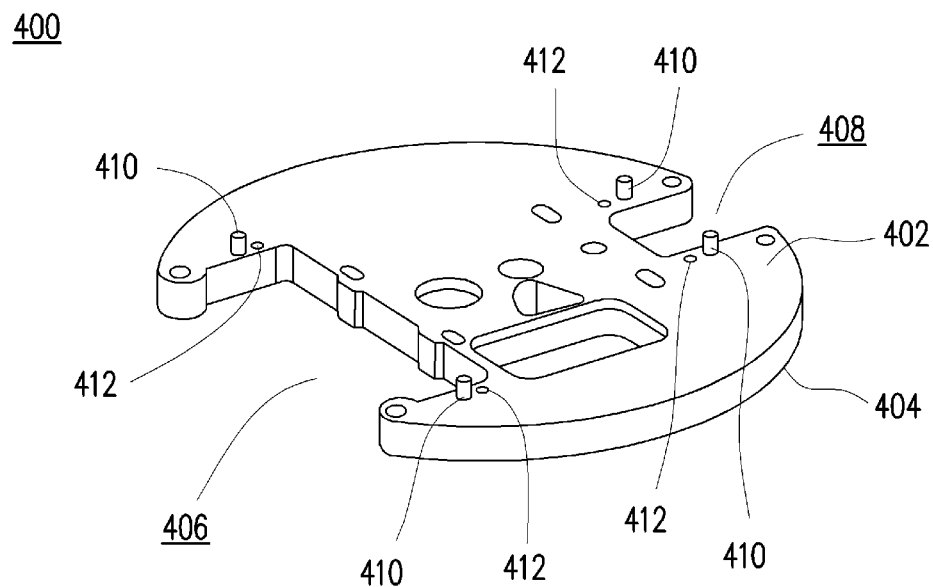
FIG. 12 is a perspective view of a base plate, in accordance with some embodiments.

FIG. 12 is a perspective view of the base plate 400 in accordance with some embodiments of the present disclosure, which engages the first arc support plate 200 and the second arc support plate 300. The base plate has an upper surface 402, a lower surface 404 opposite the upper surface, and two recesses 406, 408, one on each side of the base plate. The recesses extend entirely through the thickness of the base plate. The first arc support plate 200 will engage recess 406 with its lower end, while the second arc support plate 300 will engage recess 408 with its lower end. Alignment pins 410 are present near each recess, each of which may engage one of the smooth through-holes on an arm of an arc support plate. A bore 412 is also present near each alignment pin. A threaded screw (not shown) will pass through one of the smooth through-holes on each arm of an arc support plate and the tip of the threaded screw will engage the bore, to fix the arc support plate in place. The head of the threaded screw can contact the arm of the arc support plate. It is noted that the first arc support plate, second arc support plate, and base plate of FIGS. 4-12 are intended to be used together as a first embodiment of an assembly for supporting an arc chamber.

Figure 13:
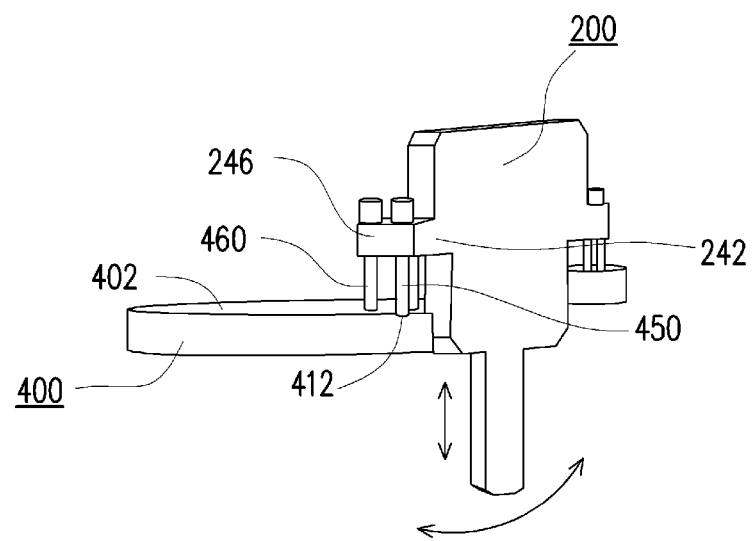
FIG. 13 is a perspective view that illustrates the engagement of an arc support plate with the base plate, in accordance with some embodiments.

FIG. 13 is a perspective view that illustrates the engagement of a first arc support plate 200 with the base plate 400. A first threaded screw (or fixed screw) 450 passes through smooth through-hole 242 on each arm of the arc support plate and the tip of the screw engages the bore 412, to fix the first arc support plate in place. The fixed screw 450 may include a smooth shank near the head of the screw, or may be threaded along the entire length of the shaft. A second threaded screw (or alignment screw) 460 will pass through the threaded through-hole 246 on each arm of the arc support plate and the tip of the screw will press against the upper surface 402 of the base plate. In some embodiments, the alignment screw 460 is threaded along the entire length of its shaft. The altitude of the arc support plate can be adjusted upwards and downwards by turning the alignment screw 460, due to engagement with the threaded through-hole of the arm 420 and against the upper surface of the base plate 400. The smooth through-hole will travel along the length of the fixed screw. The altitude and/or angle of the arc support plate relative to the base plate can thus be adjusted by appropriate adjustment of the alignment screws on the two arms of the arc support plate.

In particular embodiments, a first (i.e. fixed) screw and a second (i.e. alignment) screw are used with the arc support plates and assemblies of the present disclosure. In embodiments, the first screw and the second screw have different lengths. In more specific embodiments, the first screw and the second screw differ in length by at least 0.5 mm. In particular embodiments, the screws have a length of about 3 mm and about 2.5 mm. Generally, the longer screw passes through the smooth through-hole and into the bore in the base plate. In particular embodiments, the two screws are socket head cap screws. In other embodiments, the heads of the screws may be knurled, so that the screws can be adjusted by hand.

Figure 14:
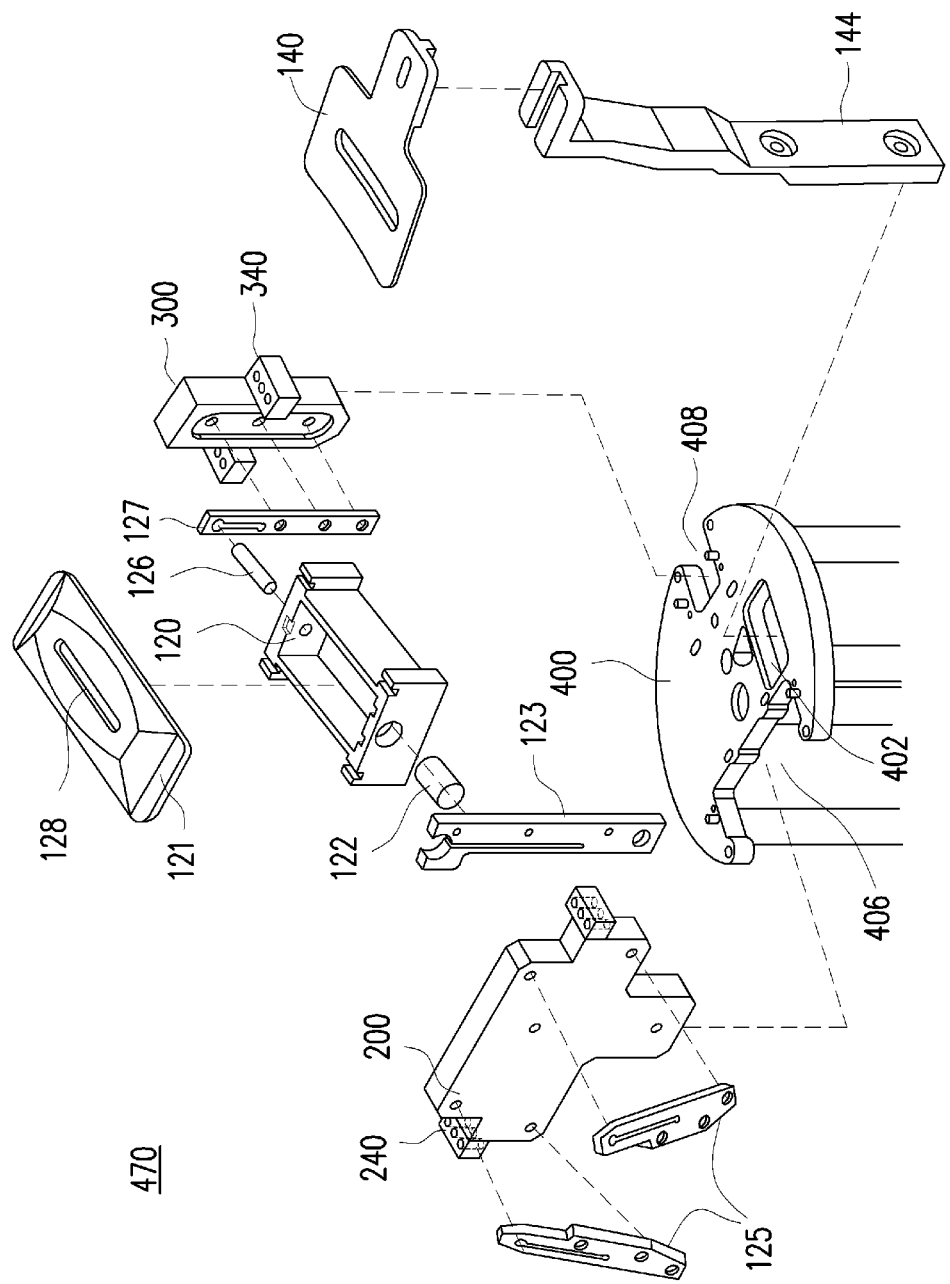
FIG. 14 is an exploded view illustrating the relative locations of various components of the ion source, in accordance with some embodiments.

FIG. 14 is an exploded view of an assembly 470 illustrating the relative locations of various components of the ion source. Here, the base plate 400, the first arc support plate 200, the second arc support plate 300, arc chamber 120, and extraction electrode 140 are shown. An anode 126, cathode 122, and filament clamp 125 are also shown.

Initially, the base plate 400 includes a first side recess 406, a second side recess 408, and a rear side recess 420. The extraction electrode 140 is attached to an adjustable support arm 144 which passes through the rear side recess 420 and attached to the base plate. The first arc support plate 200 engages the first side recess 406. Alignment pins on the base plate can engage through-holes in the arms 240 of the first arc support plate. A cathode support 123 is attached to two holes of the first arc support plate. Two angled filament clamps 125 are attached to the other four holes of the first arc support plate. The second arc support plate 300 engages the second side recess 408. Alignment pins on the base plate can also engage through-holes in the arms 340 of the second arc support plate. An anode support 127 is attached to the three holes in the main portion of the second arc support plate. The arc chamber 120 is engaged by the cathode 122 and the anode 412, which in turn engage the cathode support 123 and the anode support 127, respectively. The lid 121 of the arc chamber includes an exit slit 128.

A total of four alignment screws are present in this assembly, two per arc support plate. These alignment screws can be used to adjust the altitude and angle of the arc chamber 120 relative to the base plate 400 and the extraction electrode 140, such that the ion beam passing through the exit slit 128 of the arc chamber lid also passes through the slit 142 in the extraction electrode. The angle of the arc chamber can be adjusted along both the x-axis and the y-axis of the base plate.

Figure 15:
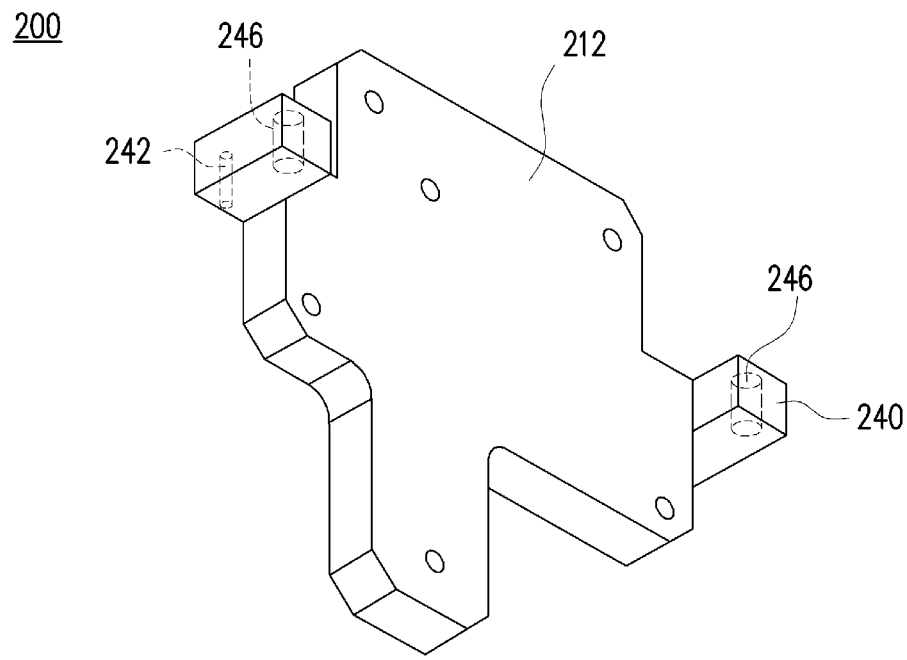
FIG. 15 is a perspective view of a second embodiment of a first arc support plate, in accordance with some embodiments.
Figure 16:
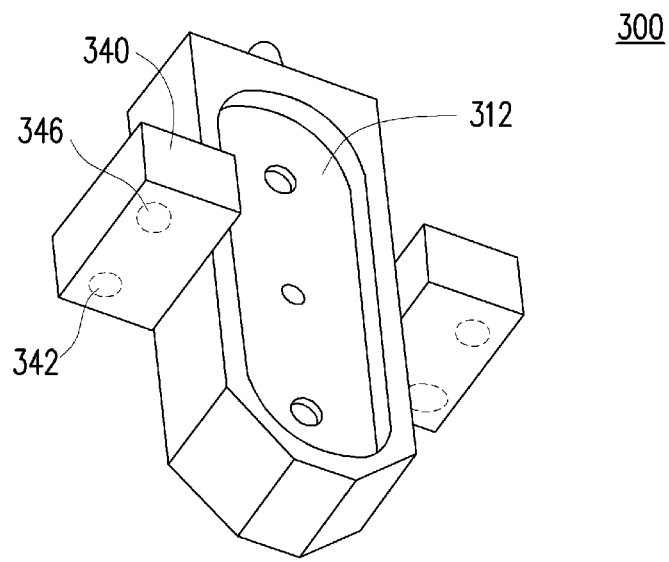
FIG. 16 is a perspective view of a second embodiment of a second arc support plate, in accordance with some embodiments.
Figure 17:
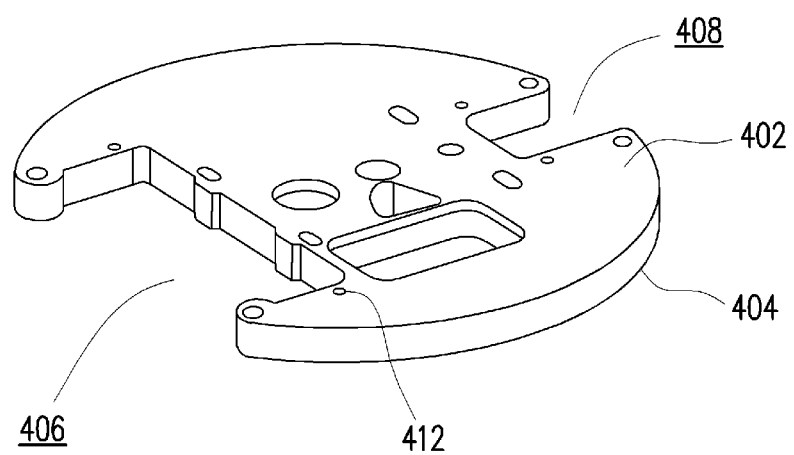
FIG. 17 is a perspective view of a second embodiment of a base, in accordance with some embodiments.

FIGS. 15-17 are illustrations of a second embodiment of an arc chamber support assembly, in accordance with some embodiments. FIG. 15 is a perspective view of a second embodiment of a first arc support plate 200. FIG. 16 is a perspective view of a second embodiment of a second arc support plate 300. FIG. 17 is a perspective view of a second embodiment of a base plate 400.

Comparing FIG. 15 to FIG. 7, the first arc support plate of FIG. 15 still includes arms 240 that extend beyond the front face 212. However, the arms only include two through-holes 242, 246. One through-hole 246 is also located beyond the front face. One through-hole 246 is threaded, and one through-hole 242 is smooth.

Similarly, comparing FIG. 16 to FIG. 11, the second arc support plate of FIG. 16 also includes arms 340 that extend beyond the front face 312. However, the arms only include two through-holes 342, 346. One through-hole 346 is also located beyond the front face. One through-hole 346 is threaded, and one through-hole 342 is smooth.

Finally, comparing the base plate of FIG. 17 to that of FIG. 12, the base plate 400 does not include the alignment pins. The alignment pins typically engage the third through-hole present in the embodiments of FIG. 7 and FIG. 11, but can be removed if desired since they may not be engaged if the altitude adjustment (using the alignment screws) raises the arc support plate above the alignment pin. Otherwise, the assembly of FIGS. 15-17 would operate in the same manner as described above with respect to FIG. 13.

A third embodiment of an arc chamber support assembly is also contemplated. In the first and second embodiments illustrated in FIGS. 4-12 and FIGS. 15-17, the alignment screws pass through the arms of the support plates and push against the base plate. In the third embodiment, the alignment screws pass through the base plate and push against the arms of the support plates. This third embodiment can be described as reversing the arrangement described in the embodiments of FIGS. 4-17.

In the third embodiment, the arc support plates include at least one arm (and in further embodiments, two arms on opposite sides) that extend forward past a front face of the arc support plate. However, the portion of the arm beyond the front face is solid, or in other words does not contain a through-hole. Instead, the base plate now includes an additional internally-threaded through-hole for each arm which extends entirely through the base plate (i.e. from the lower surface to the upper surface). The alignment screw passes through this threaded through-hole and engages the surface provided by the portion of an arm on a support plate, which can change the altitude and the angle of the arc support plate (and the attached arc chamber) relative to the base plate.

Figure 18:
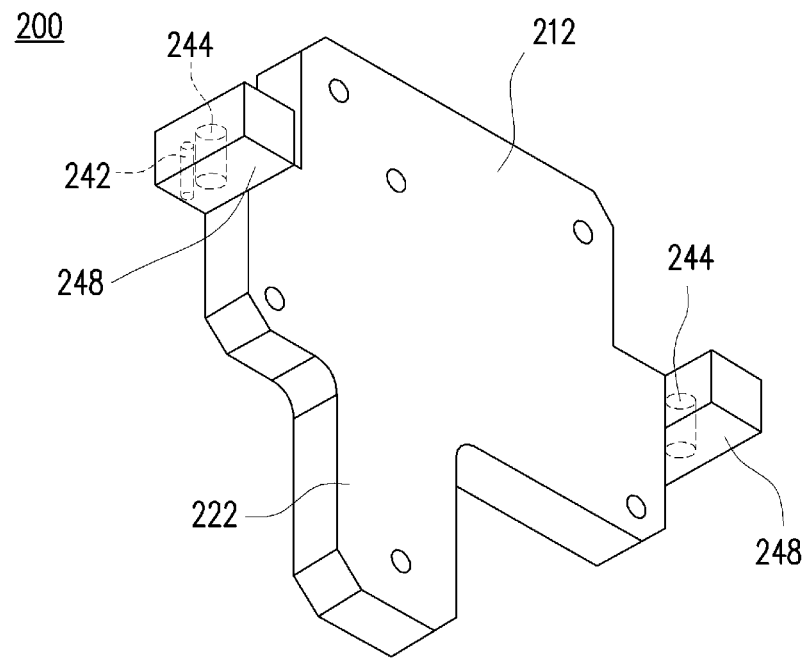
FIG. 18 is a perspective view of a third embodiment of a first arc support plate, in accordance with some embodiments.
Figure 19:
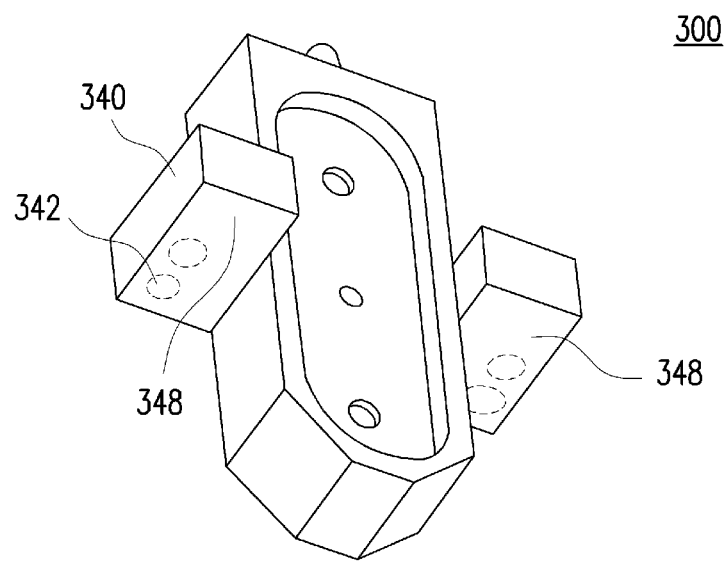
FIG. 19 is a perspective view of a third embodiment of a second arc support plate, in accordance with some embodiments.
Figure 20:
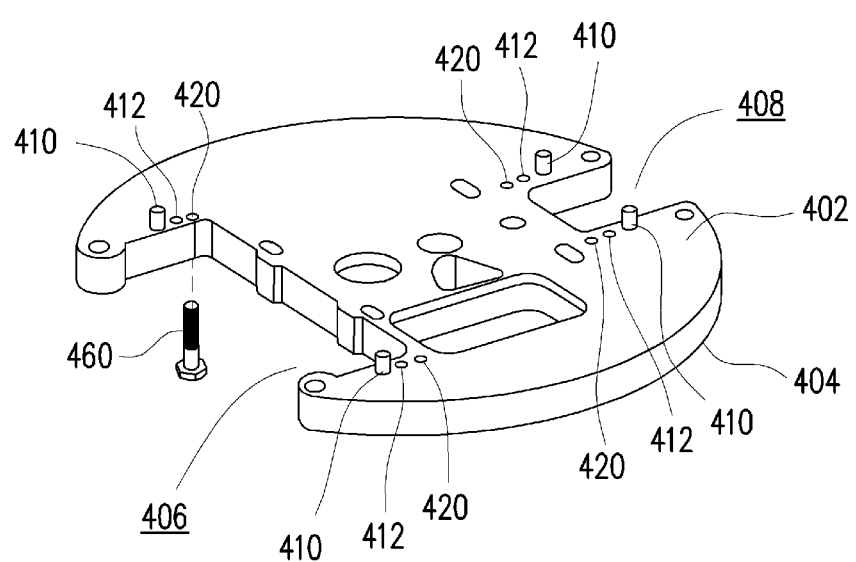
FIG. 20 is a perspective view of a third embodiment of a base, in accordance with some embodiments.

FIGS. 18-20 are illustrations of this third embodiment of an arc chamber support assembly 500, in accordance with some embodiments. FIG. 18 is a perspective view of a third embodiment of a first arc support plate 200. FIG. 19 is a perspective view of a third embodiment of a second arc support plate 300. FIG. 20 is a perspective view of a third embodiment of a base plate 400.

Comparing the first arc support plate of FIG. 18 to that of FIG. 7, the embodiment of FIG. 18 still includes arms 240 that extend beyond the front face 212. However, the arms do not include through-holes in the portion extending beyond the front face. Instead, that portion of the arm provides a lower surface 248 which can be engaged by the alignment screw. The remaining portion of the arm can contain two through-holes (like FIG. 7) or one through-hole (like FIG. 15), depending on whether alignment pin(s) are present on the base plate or not.

Similarly, comparing the first arc support plate of FIG. 19 to that of FIG. 11, the embodiment of FIG. 19 also includes arms 340 that extend beyond the front face 312. However, the arms do not include through-holes in the portion extending beyond the front face. Instead, that portion of the arm provides a lower surface 348 which can be engaged by the alignment screw. Again, the remaining portion of the arm can contain two through-holes or one through-hole, depending on whether alignment pin(s) are present on the base plate or not.

Finally, comparing FIG. 20 to FIG. 12, the base plate 400 includes a total of four additional through-holes 420, one for each of the two arms on the two arc support plates. Each through-hole is internally threaded. Each through-hole is located so as to engage an arm of an arc support plate. It is noted that these through-holes differ from the bores 412 because the bore does not extend through the entire thickness of the base plate, whereas the through-hole does extend through the entire thickness of the base plate. Alignment pins 410 may or may not be present in this third embodiment.

In use, it is contemplated that in this third embodiment of an assembly, each alignment screw 460 passes through a thread-hole 420. The head of the alignment screw 460 would contact the lower surface 404 of the base plate, rather than contacting the arms of the arc support plates as in FIG. 13. The tips of the alignment screws would push against the arms of the arc support plates, rather than pushing against the base plate as in FIG. 13. This third embodiment might be useful in applications where it is desired to adjust the altitude and angle of the arc chamber from a different location.

The first arc support plates, second arc support plates, and base plates of the present disclosure can be made using known manufacturing processes. They may be made from suitable materials which can withstand high temperatures, such as refractory metals and alloys. Examples of some materials may include nickel, zirconium, stainless steel, titanium, chromium, niobium, molybdenum, tantalum, tungsten, and alloys thereof. They can be made in the desired shapes by casting, molding, and similar processes. Finishing processes may include drilling to provide holes/bores in desired locations, grinding, etc. They are then used in an ion source as an assembly for supporting an arc chamber, and adjusting its angle and altitude to improve beam quality.

Figure 21:
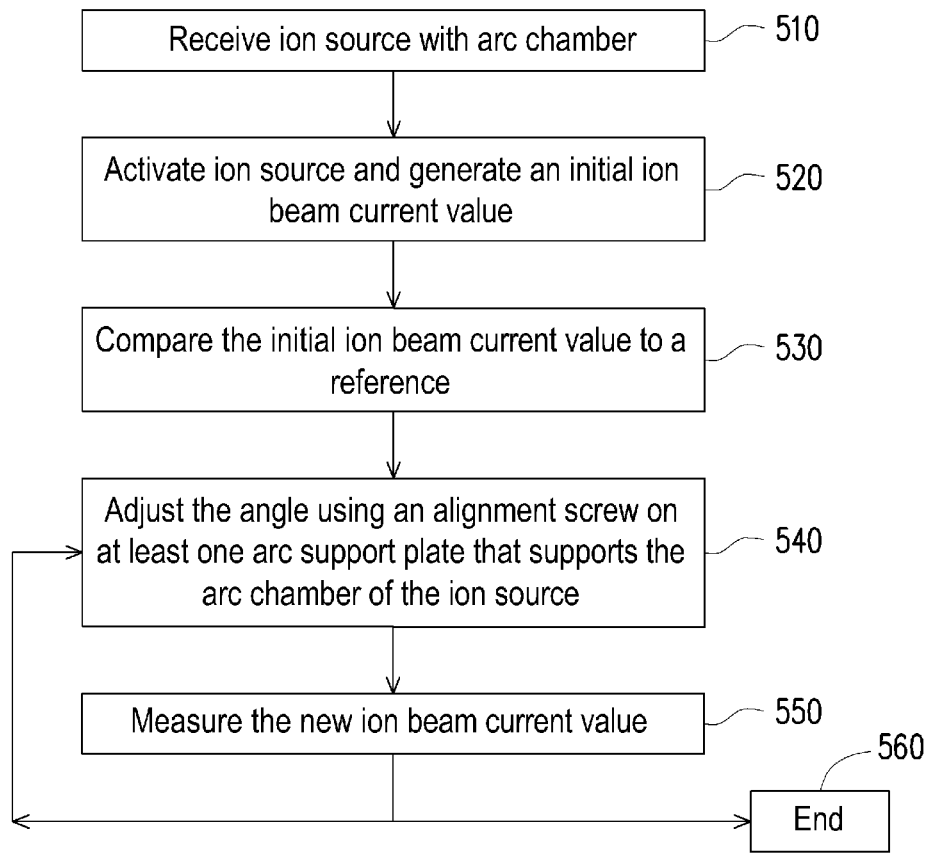
FIG. 21 is a flowchart illustrating a method for adjusting an angle of an arc chamber, in accordance with some embodiments.

FIG. 21 is a flowchart illustrating a method for adjusting an angle of an arc chamber, in accordance with some embodiments. In step 510, an ion source is received. The ion source includes a base plate, a first arc support plate, a second arc support plate, and an arc chamber supported by the two arc support plates. Each arc support plate includes at least one alignment screw which engages the base plate. An extraction electrode is also present. The arc chamber includes an exit slit, and the extraction electrode also includes a slit. The exit slit and the extraction electrode slit are arranged such that the ion beam exiting the exit slit also passes through the extraction electrode slit. Different embodiments of ion sources having these features are illustrated in FIGS. 4-20.

In step 520, the ion source is activated to generate an initial ion beam current value, which is measured beyond the extraction electrode slit. The ion beam current is reference numeral 150 in FIG. 1. In step 530, the measured value is compared to a reference to determine whether the ion beam current is sufficient for use. In this regard, as seen in FIG. 3A and FIG. 3B, insufficient alignment between the exit slit and the extraction electrode slit can reduce the ion beam current.

In step 540, the alignment screw on at least one arc support plate that supports the arc chamber is adjusted. The angle of the arc chamber is thus changed relative to the base plate to which the arc support plate is attached. This is illustrated in FIG. 13.

In step 550, the ion beam current is measured again. Desirably, this measured value is greater than the initial value measured in step 520. Steps 540, 550 can be repeated until the desired threshold value is achieved, or until the ion beam current is maximized. This is best illustrated by comparing FIG. 3A with FIG. 3B, where the better alignment of the arc chamber exit slit 128 with the extraction electrode slit 148 in FIG. 3A results in a higher ion beam current 150. The method then ends at step 560.

The ability to adjust the altitude and angle of the arc chamber has the advantage of increasing the beam quality of the ion source, as measured by the mean or median ion beam current (SI unit=amperes). This is also known as the straight beam performance from ion source to extraction. In some embodiments, the beam quality is increased by at least 4%, or by at least 5%, or by at least 6%, or by at least 7%, or by at least 8%, or by at least 9%, or by between about 4% to about 10%. In other embodiments, the axis offset can be decreased from +/−1.0 mm to +/−0.2 mm in the x-z plane or the y-z plane (where the base plate is in the x-y plane), or put another way to 20% of the original axis offset compared to a structure where the arm of the arc support plate does not have the through-hole and screw that engages the upper surface of the base plate. The increase in beam quality also provides an advantage of improved productivity, as the irradiated substrate (e.g. a silicon wafer) can be irradiated for a shorter time period to achieve the same dose, which increases throughput.

Some embodiments of the present disclosure thus describe an ion source for an ion implanter. The ion source includes an arc chamber, which is supported by an arc support plate. The arc support plate comprises a front face and at least one arm extending beyond the front face. In further embodiments, the arm contains a plurality of through-holes. In more particular embodiments, the arc support plate has two arms.

Other embodiments of the present disclosure describe an assembly for supporting an arc chamber, such as that used in an ion source. The assembly comprises a first arc support plate, a base plate, a first screw, and a second screw. The arc support plate comprises at least one arm, the at least one arm containing at least a smooth through-hole. The base plate comprises an upper surface and a bore extending into the upper surface. The first screw passes through the smooth through-hole and into the bore of the base plate. The second (or alignment) screw can adjust an angle between the first arc support plate and the base plate. In some embodiments, the arm of the first arc support plate also contains a threaded through-hole, and the second screw passes through the threaded through-hole, with the tip of the second screw engaging the upper surface of the base plate. In other embodiments, the based plate contains a threaded through-hole, and the second screw passes through the threaded through-hole, with the tip of the second screw engaging a lower surface of an arm of the first arc support plate. The assembly may further include a second arc support plate, and an arc chamber supported on opposite sides by the first arc support plate and the second arc support plate.

Other embodiments of the present disclosure relate to methods for adjusting an angle or an altitude of an arc chamber, by adjusting an alignment screw on at least one arc support plate that supports the arc chamber. This causes the angle or the altitude of the arc chamber to change relative to the base plate to which the arc support plate is attached.

The embodiments of the present disclosure are further illustrated in the following non-limiting working example, it being understood that the example is intended to be illustrative only and that the disclosure is not intended to be limited to the materials, conditions, process parameters and the like recited herein.

EXAMPLE

The beam quality of an ion source using arc support plates as illustrated in FIGS. 4-11 was compared to an ion source that did not use arc support plates having arms which extended beyond the front face and provided a screw which could be used to adjust the altitude and angle of the arc chamber. Two tests were performed, along with two comparative tests. The results are provided in the table below:

|  | CIH109-Comparative | CIH109-Example | DIH104-Comparative | DIH104-Example |
|---|---|---|---|---|
| Mean (μA) | 6724.6 | 7181.1 | 6464.4 | 7048.9 |
| Std Dev (μA) | 484.7 | 204.2 | 382.4 | 275.1 |
| Median (μA) | 6859 | 7184.1 | 6415.4 | 7045.2 |
| 5% (μA) | 6124.9 | 6762.7 | 6025.9 | 6552.9 |
| 95% (μA) | 7498.8 | 7568 | 7166.3 | 7474.8 |
| % increase (mean) |  | 6.8 |  | 9.0 |
| % increase (median) |  | 4.7 |  | 9.8 |

Both the mean and median values for the ion beam current were significantly higher for the two Examples than the two Comparative Examples. The standard deviation was also lower, i.e. the ion beam current fluctuated less even at the high currents.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An ion source for an ion implanter, comprising:
an arc chamber supported by an arc support plate;
wherein the arc support plate comprises a main portion having a front face and at least one arm, the at least one arm extending beyond the front face, and the main portion includes an upper end above the at least one arm and a lower end below the at least one arm.

2. The ion source of claim 1, wherein the arc support plate has two arms located on opposite sides of the arc support plate, the front face being located between the two arms.

3. The ion source of claim 1, wherein the at least one arm contains a plurality of through-holes.

4. The ion source of claim 3, wherein at least one through-hole in the plurality of through-holes is located in the at least one arm beyond the front face.

5. The ion source of claim 3, wherein the plurality of through-holes includes a threaded through-hole and a smooth through-hole.

6. The ion source of claim 3, wherein the plurality of through-holes includes one threaded through-hole and two smooth through-holes.

7. The ion source of claim 1, wherein the main portion further comprises two shoulders, such that a length of the upper end is shorter than a length of the lower end.

8. The ion source of claim 7, further comprising a leg extending downwards from the lower end of the main portion, wherein the leg is offset to one side.

9. An assembly for supporting an arc chamber, comprising:
   a first arc support plate, a base plate, a first screw, and a second screw;
   wherein the first arc support plate comprises at least one arm, the at least one arm extending beyond the front face and containing a smooth through-hole;
   wherein the base plate comprises a bore extending into an upper surface;
   wherein the first screw passes through the smooth through-hole and into the bore of the base plate; and
   wherein the second screw can adjust an angle between the first arc support plate and the base plate.

10. The assembly of claim 9, wherein the at least one arm of the first arc support plate also contains a threaded through-hole; and
   wherein the second screw passes through the threaded through-hole and engages an upper surface of the base plate.

11. The assembly of claim 10, wherein the threaded through-hole is located in the at least one arm beyond the front face of the first arc support plate.

12. The assembly of claim 9, wherein the base plate also contains a threaded through-hole; and
   wherein the second screw passes through the threaded through-hole and engages a lower surface of the at least one arm of the first arc support plate.

13. The assembly of claim 9, wherein the first screw and the second screw are of different lengths, and optionally wherein the first screw and the second screw differ in length by at least 0.5 mm.

14. The assembly of claim 9, wherein the first arc support plate has two arms located on opposite sides of the first arc support plate and extending forward beyond a front face of the first arc support plate, with a front face of the first arc support plate being located between the two arms.

15. The assembly of claim 9, further comprising:
   a second arc support plate; and
   an arc chamber supported on opposite sides by the first arc support plate and the second arc support plate.

16. The assembly of claim 15, wherein the second arc support plate has a different shape from the first arc support plate.

17. A method of adjusting an angle of an arc chamber, comprising:
   adjusting an alignment screw so as to change an angle of at least one arc support plate that supports the arc chamber, relative to a base plate to which the arc support plate is attached.

18. The method of claim 17, wherein the arc chamber is supported by two arc support plates that engage the base plate.

19. The method of claim 17, wherein the alignment screw passes through an arm of the at least one support plate and pushes against an upper surface of the base plate; or
   wherein the alignment screw passes through the base plate and pushes against a lower surface of an arm of the at least one support plate.

20. The method of claim 17, wherein the base plate further comprises at least one alignment pin for engaging a smooth through-hole on an arm of the at least one support plate.

\* \* \* \* \*